United States Patent
Cho

(10) Patent No.: US 9,818,581 B1
(45) Date of Patent: Nov. 14, 2017

(54) DIELECTRIC WINDOW SUPPORTING STRUCTURE FOR INDUCTIVELY COUPLED PLASMA PROCESSING APPARATUS

(71) Applicant: VNI SOLUTION Co., LTD., Daejeon-si (KR)

(72) Inventor: Saeng Hyun Cho, Suwon-si (KR)

(73) Assignee: VNI SOLUTION CO., LTD., Daejeon-si (KR)

( * ) Notice: Subject to any disclaimer, the term of this patent is extended or adjusted under 35 U.S.C. 154(b) by 0 days.

(21) Appl. No.: 15/152,258

(22) Filed: May 11, 2016

(30) Foreign Application Priority Data

May 3, 2016 (KR) ........................ 10-2016-0054371

(51) Int. Cl.
H01J 37/32 (2006.01)
(52) U.S. Cl.
CPC ..... H01J 37/32119 (2013.01); H01J 37/3211 (2013.01); H01J 37/32715 (2013.01); H01J 37/32834 (2013.01)

(58) Field of Classification Search
None
See application file for complete search history.

(56) References Cited

U.S. PATENT DOCUMENTS

| | | | | |
|---|---|---|---|---|
| 6,227,140 B1* | 5/2001 | Kennedy | ............. | C23C 16/4401 118/723 R |
| 6,331,754 B1* | 12/2001 | Satoyoshi | ............. | H01J 37/321 118/723 I |
| 6,451,161 B1* | 9/2002 | Jeng | ...................... | H01J 37/321 118/723 I |
| 6,462,483 B1* | 10/2002 | Jeng | ...................... | H01J 37/321 315/111.21 |
| 6,729,261 B2* | 5/2004 | Hongo | .................. | C23C 16/511 118/723 MW |
| 7,196,283 B2* | 3/2007 | Buchberger, Jr. . | | H01J 37/32082 156/345.34 |

(Continued)

FOREIGN PATENT DOCUMENTS

JP 2015-524607 A 8/2015
KR 10-2004-0105606 A 12/2004

(Continued)

*Primary Examiner* — Douglas W Owens
*Assistant Examiner* — Srinivas Sathiraju
(74) *Attorney, Agent, or Firm* — Rabin & Berdo, P.C.

(57) ABSTRACT

A dielectric window supporting structure of inductively coupled plasma (ICP) processing apparatus that includes a main container that houses a substrate to perform plasma processing, a substrate mounting unit on which the substrate is mounted, an exhaust system, a plurality of dielectric windows that form an upper window of the main container, a dielectric supporting unit coupled to an upper end of the main container and supports the dielectric window to seal the inside of the main container, and one or more RF antennas installed to correspond to plurality of the dielectric windows outside the main container. The dielectric supporting unit includes a central frame which supports a bottom edge of the dielectric window and an outer frame which supports the central frame. The outer frame is supported by the upper end of the main container. The central frame includes ceramic material and the outer frame includes metallic material.

6 Claims, 9 Drawing Sheets

(56) References Cited

U.S. PATENT DOCUMENTS

| | | | | |
|---|---|---|---|---|
| 7,220,937 | B2* | 5/2007 | Hofman | H01J 37/32183 118/723 I |
| 8,261,691 | B2* | 9/2012 | Yamazawa | H01J 37/32091 118/723 E |
| 8,597,463 | B2* | 12/2013 | Sasaki | C23C 16/505 118/723 AN |
| 8,894,806 | B2* | 11/2014 | Koshimizu | H01J 37/32091 118/728 |

FOREIGN PATENT DOCUMENTS

| | | |
|---|---|---|
| KR | 10-2013-0084627 A | 7/2013 |
| KR | 10-2013-0091265 A | 8/2013 |
| KR | 10-2014-0103838 A | 8/2014 |
| KR | 10-2015-0108344 A | 9/2015 |
| KR | 10-2016-0040512 A | 4/2016 |
| KR | 10-2016-0043084 A | 4/2016 |

* cited by examiner

DIELECTRIC WINDOW SUPPORTING STRUCTURE FOR INDUCTIVELY COUPLED PLASMA PROCESSING APPARATUS

CROSS-REFERENCE TO RELATED APPLICATION

This application claims priority to Korean Patent Application No. 10-2016-0054371 filed on May 3, 2016 and all the benefits accruing therefrom under 35 U.S.C. §119, the contents of which are incorporated by reference in their entirety.

BACKGROUND OF THE INVENTION

1. Field of the Invention

The present disclosure relates to an inductively coupled plasma processing apparatus that performs substrate processing, such as substrate etching or deposition.

2. Background of the Invention

In order to perform predetermined processing on a substrate in the manufacturing process of a liquid crystal display (LCD) or an organic light-emitting diode (OLED), various plasma processing apparatuses such as a plasma etching apparatus or plasma CVD deposition apparatus are used. A capacitively coupled plasma processing apparatus has been typically used as such a plasma processing apparatus, but in recent, an inductively coupled plasma (ICP) processing apparatus that has a big advantage of being capable of obtaining high-density plasma at high degree of vacuum is receiving attention.

The ICP processing apparatus disposes an RF antenna outside the dielectric window of a main container that houses a substrate to be processed, and applies RF power to the RF antenna simultaneously with supplying a processing gas into the main container to generate ICP in the main container and perform predetermined plasma processing on the substrate to be processed by the ICP. As the RF antenna of the ICP processing apparatus, a planar antenna that has a vortex pattern is being mostly used.

However, with a recent increase in the size of a substrate, there is a need for an increase in the size of a plasma processing apparatus in order to process larger substrate that excesses 1 m in the length of one side thereof.

Thus, as the ICP processing apparatus for processing the large substrate also increases in size, the variation of plasma density on the plane of the substrate to be processed increases and thus there is limitation that it is difficult to perform uniform substrate processing.

In particular, as the ICP processing apparatus also increases in size, the dielectric window is divided into in plural and the divided plurality of dielectric windows are generally supported by the lattice type supporting structure of metallic material.

However, the conventional lattice type supporting structure has a problem in that since the power induced by the antenna is transferred to the metallic supporting structure, Eddy current may occur

SUMMARY OF THE INVENTION

The present disclosure provides a dielectric window supporting structure of inductively coupled plasma (ICP) processing apparatus capable of minimizing power loss due to the supporting structure by replacing the dielectric supporting structure in the region where antenna is installed, with ceramic.

To achieve these and other advantages and in accordance with the purpose of the present invention, there is provided a dielectric window supporting structure of an inductively coupled plasma (ICP) processing apparatus that includes a main container 10 that houses a substrate to be processed S to perform plasma processing, a substrate mounting unit 20 on which the substrate to be processed S is mounted in the main container 10, an exhaust system 30 that discharges gas from inside of the main container 10, a plurality of dielectric windows 100 that form an upper window of the main container 10, a dielectric supporting unit 400 that is coupled to an upper end of the main container 10 and supports the dielectric window 100 to seal the inside of the main container 10, and one or more RF antennas 40 which are installed to correspond to plurality of the dielectric windows 100 outside the main container 10 and to which RF power is supplied to form induced electric field in the main container 10, wherein the dielectric supporting unit 400 includes an outer frame 410 that is supported at the upper end of the main container 10, and a central frame 420 that is coupled to the outer frame 410, includes an opening 401 corresponding to the plan view of each dielectric window 100, includes a supporting portion 402 supporting the bottom edge of the dielectric window 100, and has a ceramic material at least partly. An upper frame 12 is provided on the dielectric supporting unit 400 to surround the RF antennas 40.

According to an embodiment, the plan views of the dielectric supporting unit 400 and the dielectric window 100 may desirably be rectangles.

More particularly, the central frame 420 may be divided into a plurality of sections in the direction of at least one of both sides of the rectangle around the openings 401.

In addition, the central frame 420 divided into the plurality of sections may have a protrusion 434 and a recess 422 at a surface being in contact with an adjacent central frame 420 to partly overlap when viewed in the vertical direction.

Also, the central frame 420 divided into the plurality of sections may desirably be coupled by ceramic bonding.

According to the present invention, a support structure that supports a plurality of dielectric windows may include an outer frame that supports the upper end of a main container and a central frame that supports the plurality of dielectric windows inside of the outer frame, and at least a portion of or desirably a whole of the central frame may be formed from ceramic material so that it is possible to minimize power loss by metallic material when induced electric field by an antenna is formed.

According to an embodiment, the outer frame is formed from metallic material and the central frame on which an antenna is installed is formed from ceramic material such as $Al_2O_3$ to remove a metal member from the lower part of the antenna so that it is possible to minimize power loss by metallic material when induced electric field by an antenna is formed.

According to a more particular embodiment, the ceramic central frame is divided between openings at which dielectric windows are installed respectively so that it is possible to efficiently close the upper opening of a main container in order to process a large substrate to be processed.

According to a more particular embodiment, the divided central frame is in close contact with an adjacent central frame in a structure, such as a stepped structure, a protrusion and a recess at a part where they are in contact with each other so that it is possible to effectively seal the inside of the main container.

According to a more particular embodiment, the divided central frame is coupled to an adjacent central frame by ceramic bonding so that it is possible to minimize the usage of a metal member to minimize power loss, i.e., current loss.

According to an embodiment, an RF antenna has a plate structure having width and thickness and is a combination of a horizontal antenna portion and a vertical antenna portion, wherein the normal of a surface of the RF antenna having the width in the horizontal antenna portion is perpendicular to the top surface of the dielectric window and the normal of a surface of the RF antenna having the width in the vertical antenna portion is parallel to the top surface of the dielectric window so that it is possible to effectively match the density of plasma formed inside a main container with a required process condition.

According to a particular embodiment, since a vertical antenna portion increases current and decreases voltage in comparison to a horizontal antenna portion, the vertical antenna portion and the horizontal antenna portion are installed in a series, parallel or series-parallel combination according to the required condition of plasma density formed at an upper region for processing a substrate to be processed so that it is possible to effectively match the density of plasma formed inside a main container with a required process condition.

DETAILED DESCRIPTION OF THE INVENTION

Figure 1:
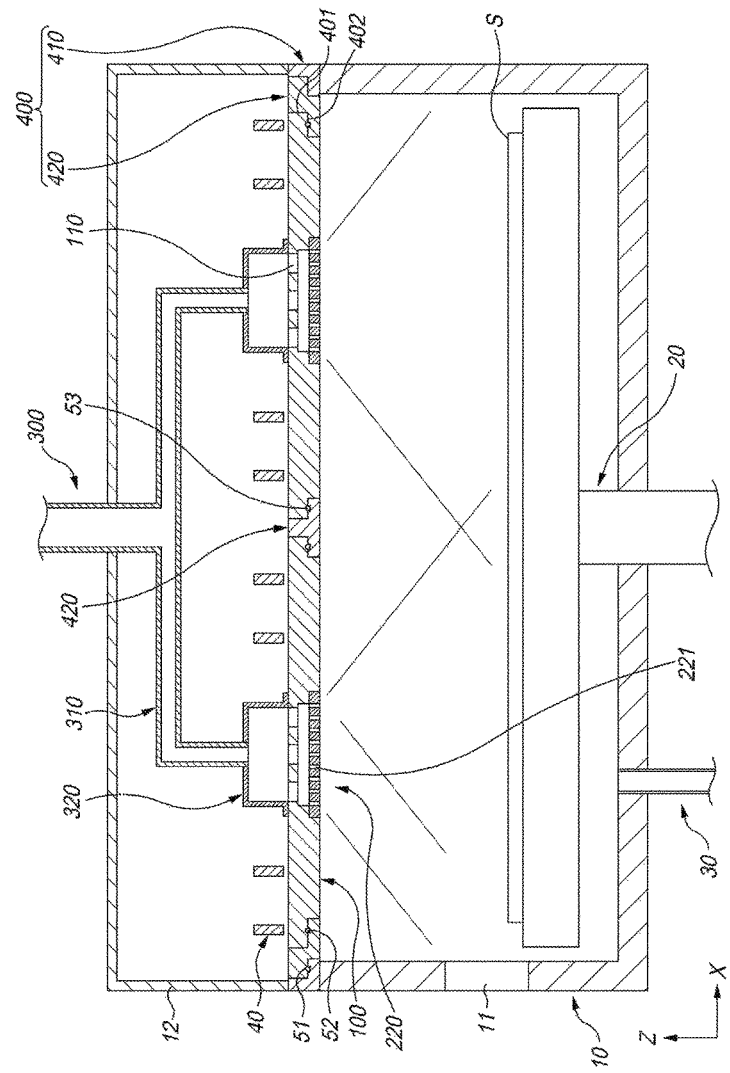
FIG. 1 is a cross-sectional view showing an inductively coupled plasma processing apparatus according to an embodiment of the present invention.
Figure 2:
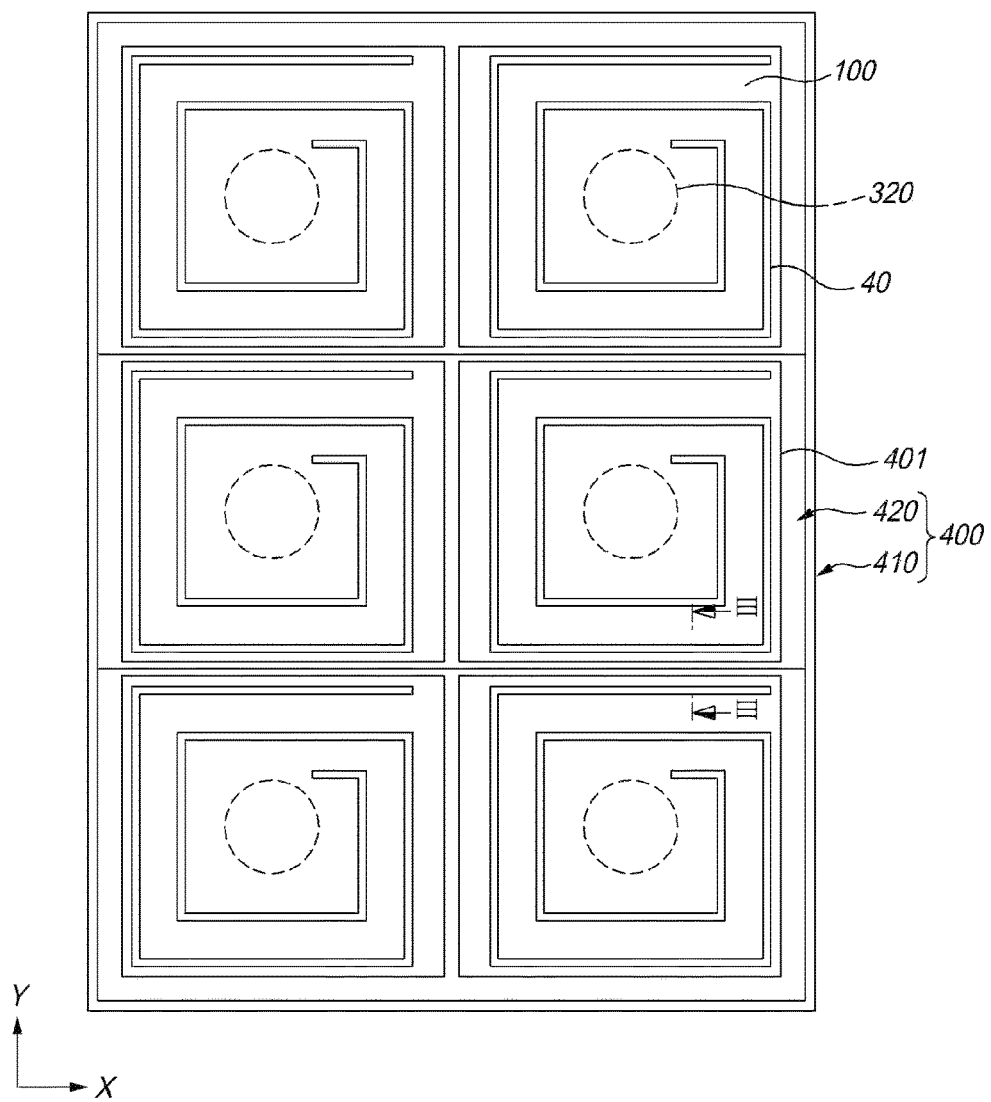
FIG. 2 is a plan view showing a dielectric window and a supporting member in FIG. 1.
Figure 3A:
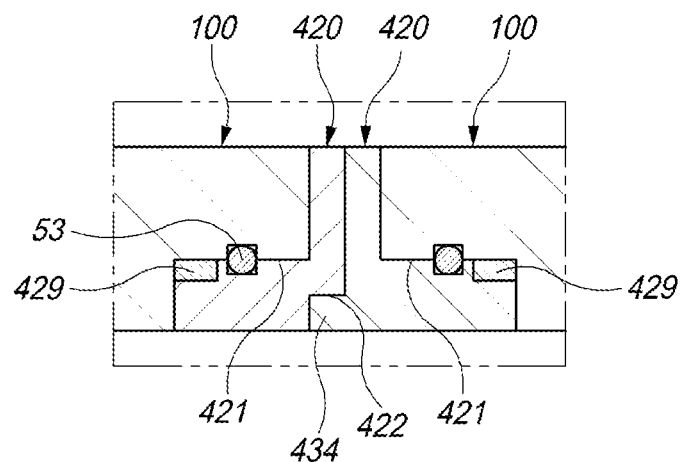
FIG. 3a and FIG. 3b are cross-sectional views taken along line III-III in FIG. 2.
Figure 3B:
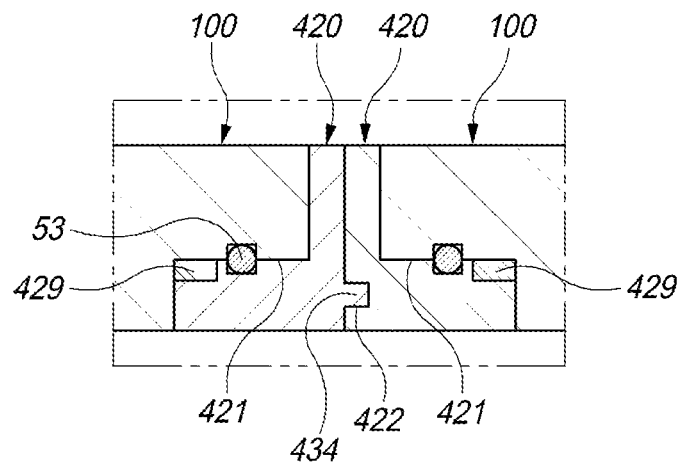
Figure 4:
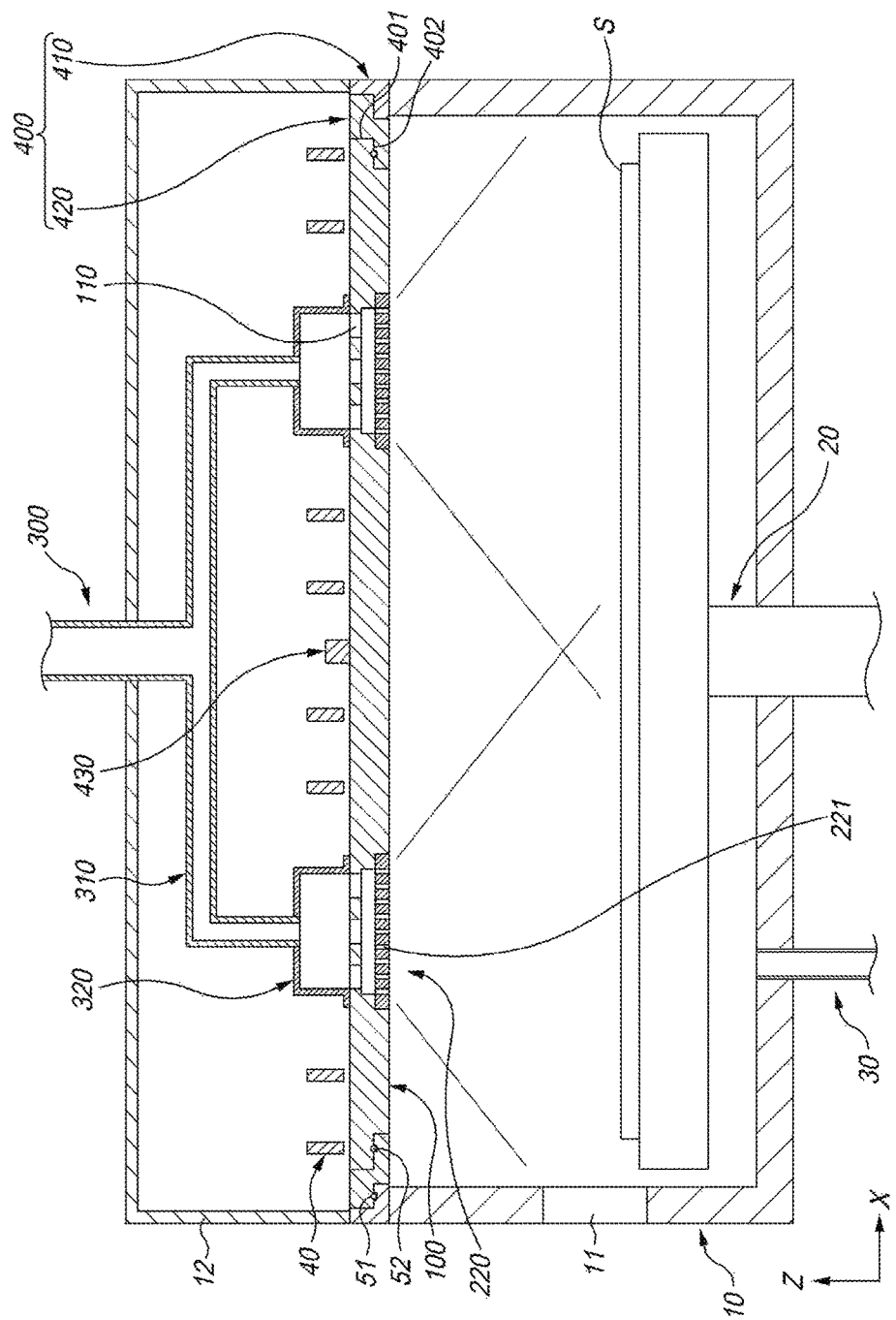
FIG. 4 is a cross-sectional view showing a modified example of the support structure of a dielectric window as a cross-sectional view taken along line III-III in FIG. 2.
Figure 5:
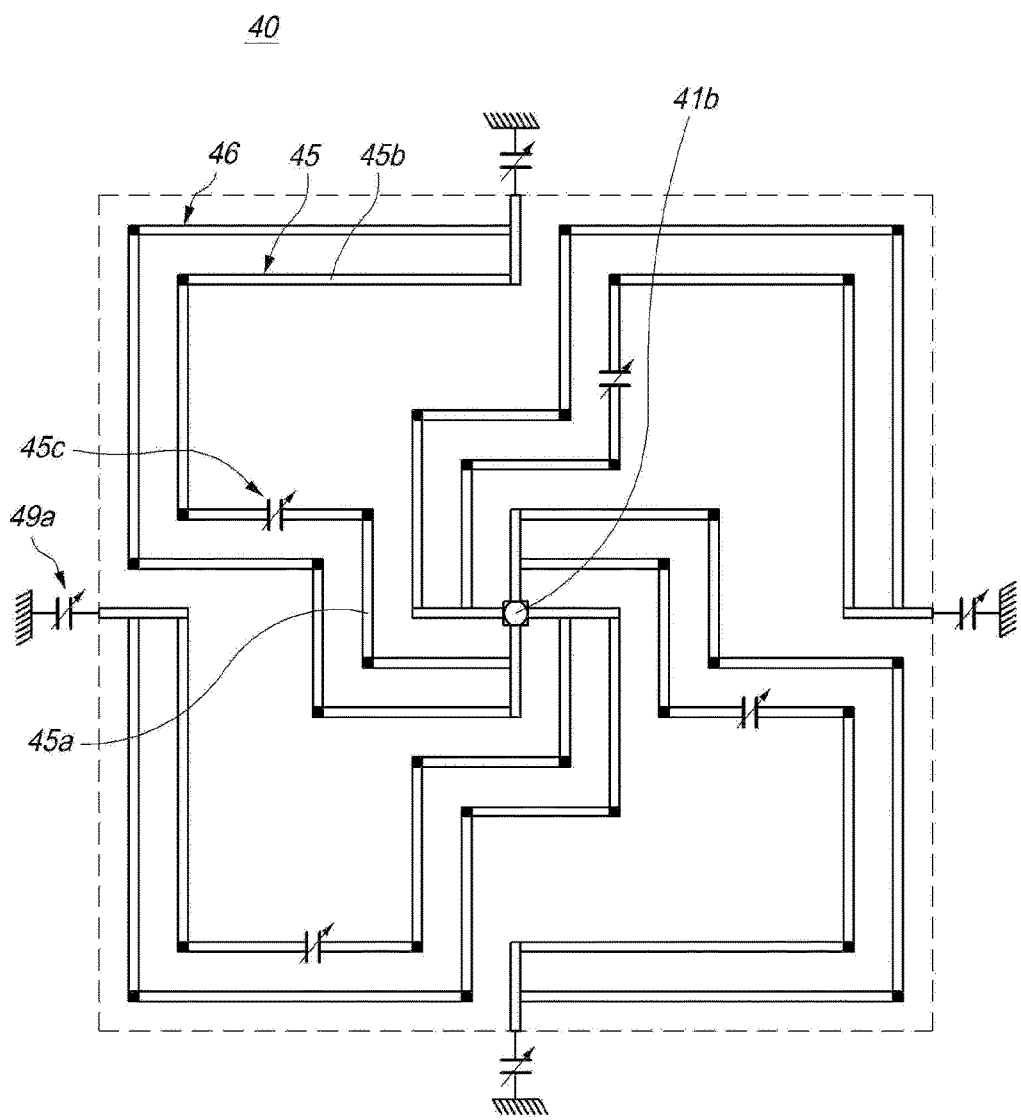
FIG. 5 is a plan view showing an example of an RF antenna that is installed at the apparatus shown in FIG. 1.
Figure 6:
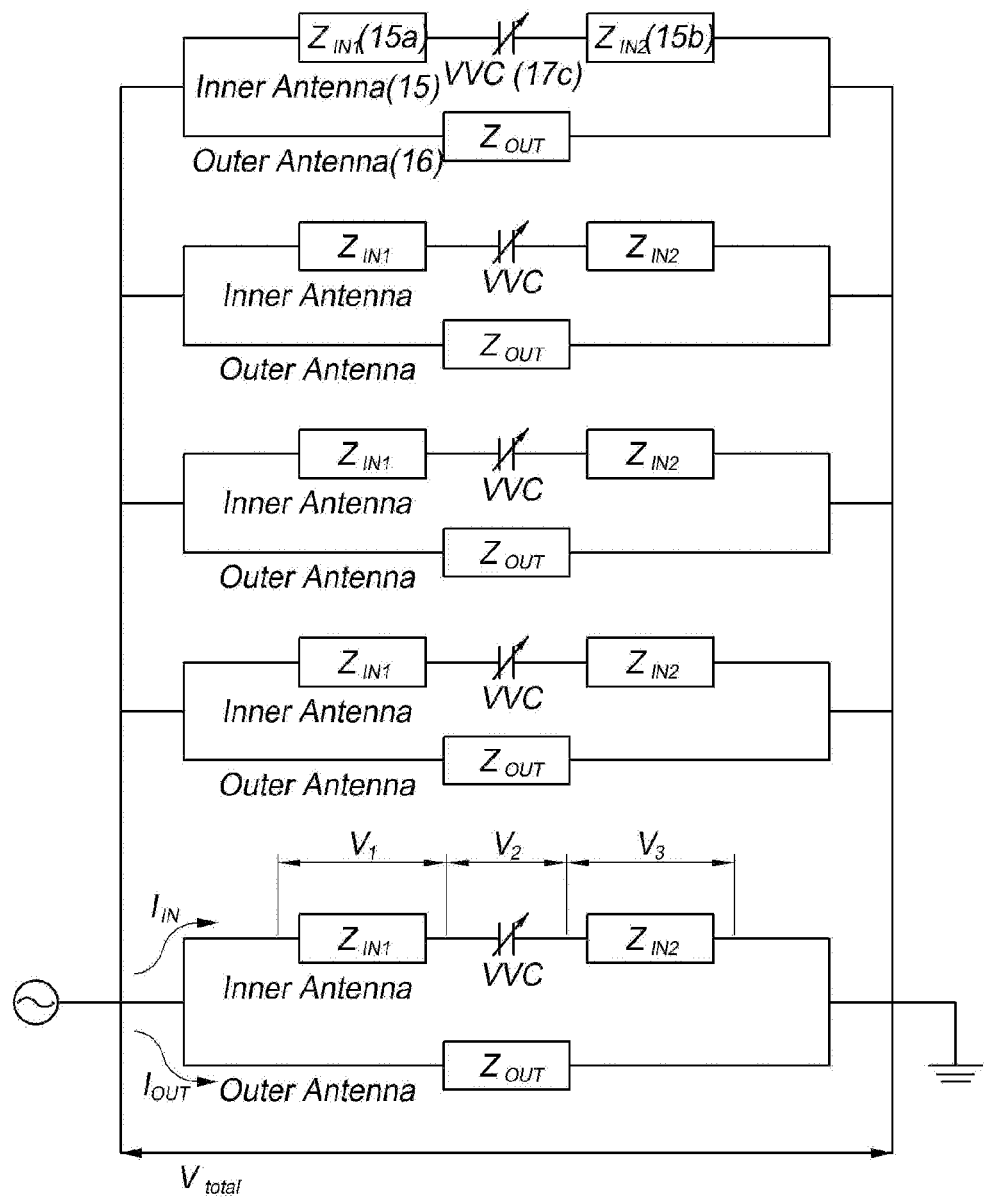
FIG. 6 is an equivalent circuit diagram of the RF antenna in FIG. 2.
Figure 7:
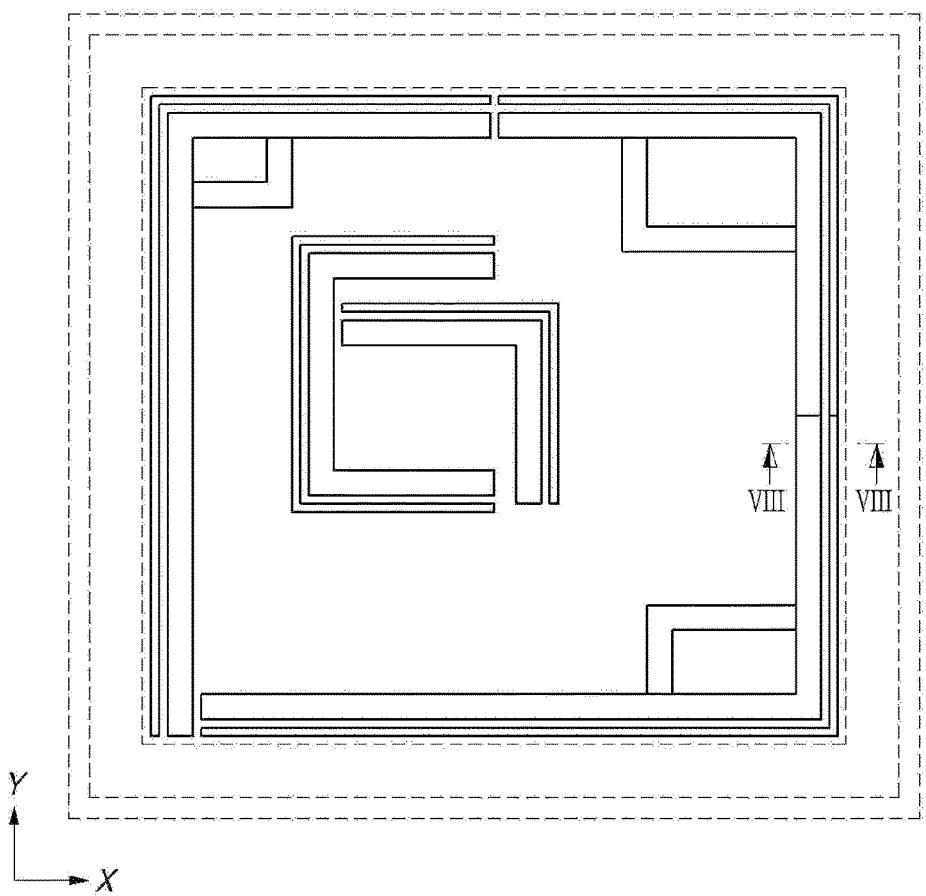
FIG. 7 is a plan view showing an example of an arrangement of an RF antenna that is installed at the apparatus shown in FIG. 1.
Figure 8:
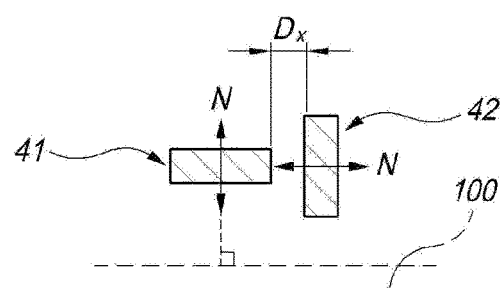
FIG. 8 is a cross-sectional view taken along line VIII-VIII in FIG. 7.

In the following, an embodiment of the present invention is described with reference to the accompanying drawings. FIG. 1 is a cross-sectional view showing an inductively coupled plasma processing apparatus according to an embodiment of the present invention, FIG. 2 is a plan view showing a dielectric window and a supporting member in FIG. 1, FIG. 3a and FIG. 3b are cross-sectional views taken along line III-III in FIG. 2, FIG. 4 is a cross-sectional view showing a modified example of the support structure of a dielectric window as a cross-sectional view taken along line III-III in FIG. 2, FIG. 5 is a plan view showing an example of an RF antenna that is installed at the apparatus shown in FIG. 1, FIG. 6 is an equivalent circuit diagram of the RF antenna in FIG. 2, FIG. 7 is a plan view showing an example of an arrangement of an RF antenna that is installed at the apparatus shown in FIG. 1, FIG. 8 is a cross-sectional view taken along line VIII-VIII in FIG. 7, and FIG. 9a to FIG. 9f are cross-sectional views showing modified examples of FIG. 8.

The ICP processing apparatus according to an embodiment of the present invention includes a main container 10 that houses a substrate to be processed S to perform plasma processing, a substrate mounting unit 20 on which the substrate to be processed S is mounted in the main container 10, an exhaust system 30 that discharges gas from the inside of the main container 10, one or more dielectric windows 100 that form the upper window of the main container 10, and one or more RF antennas 40 which are installed to correspond to the dielectric windows 100 outside the main container 10 and to which RF power is applied to form induced electric field in the main container 10.

The apparatus may be used in order to perform a substrate processing process, such as etching a metal layer, ITO layer, oxide layer or the like or forming a disposition layer when forming a thin film transistor on the substrate to be processed in manufacturing e.g., a liquid crystal display (LCD) or organic light-emitting diode (OLED).

Here, the substrate S to be processed may generally have a rectangular shape and be 1 m or more in the size of one side.

The main container 10 is a component that houses the substrate to be processed S to form an inner space in which plasma processing is performed.

The main container 10 may have a quadrilateral barrel that is formed from conductive material, e.g., aluminum having anodized inner wall, be assembled and dissembled, and be grounded by a ground line (not shown).

In addition, a gate for introducing/withdrawing the substrate S and a gate valve (not shown) for opening/closing the gate are installed on the sidewall of the main container 10.

The substrate mounting unit 20 may be formed from conductive material, e.g., aluminum having an anodized surface. The substrate S mounted on the substrate mounting unit 22 may attached to the substrate mounting unit 22 by an electrostatic chuck (not shown).

In addition, the substrate mounting unit 22 may be connected to a RF power source (not shown) via a matcher (not shown) by a power supply rod (not shown).

The RF power source may apply bias RF power, e.g., RF power having a frequency of 6 MHz to the substrate mounting unit 22 during the plasma processing. By the bias RF power, ions in the plasma generated in the main container 10 may effectively enter the substrate S.

Also, in order to control the temperature of the substrate S, a temperature control device that includes a heating device, such as a ceramic heater or a refrigerant flow path, and a temperature sensor (that are not shown) are installed in the substrate mounting unit 22.

The exhaust system 30 is a component that discharges gas from the inside of the main container 10.

The exhaust system 30 includes an exhaust pipe to which an exhaust device including a vacuum pump is connected, in the bottom of the main container 10, the gas from the main container 10 is exhausted by the exhaust device, and the inside of the main container 10 is set and maintained to be predetermined vacuum atmosphere (e.g., 1.33 Pa) during the plasma processing.

The RF antenna 40 is a component which is installed to correspond to the dielectric window 100 outside the main container 10 and to which RF power is applied to form induced electric field in the main container 10, and may have various structures and patterns as shown in FIGS. 5 to 7.

The RF antenna 40 may be installed within a certain distance from the dielectric window 100 by a spacer (not shown) that is formed from an insulation member.

Also, the RF antenna 40 may be installed in such a manner that a portion thereof is buried in the dielectric window 100, though not shown.

In addition, one or more power supply members (not shown) are installed for power supply to the RF antenna 40, and RF power (not shown) is connected to these power supply members via a matcher (not shown).

During the plasma processing, RF power for induced electric field formation, e.g., RF power having a frequency of 13.56 MHz may be applied from the RF power source to the RF antenna 40. As such, induced electric field is formed in the main container 10 by the RF antenna 40 to which the RF power is applied, and a processing gas is changed to plasma by the induced electric field. The output power of the RF power source is appropriately set to be a value sufficient to generate plasma.

The RF antenna 40 is a component which is installed at a part corresponding to the dielectric window 100 outside the main container 10 and to which RF power is applied to form induced electric field in the main container, and may have various structures and patterns.

According to an embodiment, the RF antenna 40 includes a plurality of distribution line groups that includes a first antenna plate 45 and a second antenna plate 46 that are, on one end, connected to a power supply member 47b, then branch, and are arranged in parallel to each other, and that are merged and grounded on the other end, as shown in FIGS. 5 and 6.

In addition, each distribution line group includes a first antenna plate 45 and a second antenna plate 46 that are, on one end, connected to a power supply member 47b, then branch, and are arranged in parallel to each other, and that are merged and grounded on the other end.

Here, the first antenna plate 45 and the second antenna plate 46 may have a plate shape that has their arrangement directions as length directions.

The RF antenna that has such a structure may be arranged in various forms as shown in FIG. 5.

According to an embodiment, the RF antenna 40 may be arranged in a spiral shape outwards from the central portion of the dielectric window 100.

The first antenna plate 45 may include an inner antenna plate 45a that is connected to the power supply member 47b on one end, an outer antenna plate 45b that is grounded on the other end, and a variable capacitor 45c that is installed between the inner antenna plate 45a and the outer antenna plate 45b.

When as such, the first antenna plate 45 includes the variable capacitor 45c between the inner antenna plate 45a and the outer antenna plate 45b, it is possible to uniformly form plasma formed by the RF antenna 40 through the adjustment of the variable capacitor 45c.

The variable capacitor 45c is a component that is installed between the inner antenna plate 45a and the outer antenna plate 45b to change a capacitor value to optimally form uniform plasma.

In addition, a vacuum variable condenser may be used as the variable capacitor 45c.

The RF antenna 40 that includes the plurality of distribution line groups is installed in various structures; for example, three or four RF antennas may be arranged to correspond to the plane shape of the dielectric window 100, such as a rectangle or circle.

According to an embodiment, the dielectric window 100 may have a plan view corresponding to a rectangle and four distribution line groups may be installed so that the distribution line groups may be grounded at the center of each side of the rectangle.

Here, the power supply member 47b branches from the center of the dielectric window 100 toward the center of each side to be four branches and then is connected to the four distribution line groups, respectively.

In addition, the first antenna plate 45 and the second antenna plate 46 may include a first bent portion that forms 90° with respect to the power supply member 47b, a second bent portion that forms 90° with respect to the first bent portion, a third bent portion that forms 270° with respect to the second bent portion, a fourth bent portion that forms 270° with respect to the third bent portion, and a fifth bent portion that forms 90° with respect to the fourth bent portion.

The first bent portion and the second bent portion are generally positioned at the central portion of the dielectric window 100, the fourth bent portion and the fifth bent portion are generally positioned at the edge portion of the dielectric window 100, and the third bent portion connects the central portion to the edge portion.

In such a plasma optimization, each of the plurality of distribution line groups may be additionally connected to the variable capacitor 19a, such as a vacuum variable condenser and then grounded.

In such a plasma optimization, each of the plurality of distribution line groups may also be connected to the power supply member 17b after being additionally connected to the variable capacitor (not shown), such as a vacuum variable condenser.

In such a plasma optimization, each of the plurality of distribution line groups may also control the current of the second antenna plate 16 together when adjusting the capacitor of the first antenna plate 15.

The above-described structure may be used for voltage control through the first antenna plate 45 in which the variable capacitor 45c is installed, and it is possible to combine current control by the second antenna plate 46 that has no variable capacitor 45c, thus more efficient plasma control is possible.

The plasma formed in the main container 10 depends on the structure and pattern of the RF antenna 40 that is installed over the dielectric window 100.

In particular, the RF antenna 40 may be installed in the pattern and structure shown in FIGS. 5 and 7.

According to a more particular embodiment, as shown FIGS. 7 to 9f, the RF antenna 40 has a plate structure having width and thickness, and may be a combination of a horizontal antenna portion 41 and a vertical antenna portion 42. The normal N of a surface of the RF antenna having the width in the horizontal antenna portion 41 is perpendicular to the top surface of the dielectric window 100 and the normal N of a surface of the RF antenna having the width in the vertical antenna portion 42 is parallel to the top surface of the dielectric window 100.

The horizontal antenna portion 41 is a portion in which the normal N of a surface of the horizontal antenna portion 41 in the RF antenna 40 having the width is perpendicular to the top surface of the dielectric window 100, and may be arranged to be parallel to the top surface of the dielectric window 100.

In addition, the horizontal antenna portion 41 may have various structures; for example, it may be an independent member or coupled integrally to another part.

The vertical antenna portion 42 is a portion in which the normal N of a surface of the vertical antenna portion 42 in the RF antenna 40 having the width is parallel to the top surface of the dielectric window 100, and may be arranged to be perpendicular to the top surface of the dielectric window 100.

In addition, the vertical antenna portion 42 may have various structures; for example, it may be an independent member or coupled integrally to another part.

The present invention may have an optimal arrangement and structure through an experiment as a combination for controlling plasma density formed by a combination of the horizontal antenna portion 41 and the vertical antenna portion 42, i.e., in a series, parallel or series-parallel combination.

According to an embodiment, the combination of the horizontal antenna portion 41 and the vertical antenna portion 42 may be installed over a whole of an upper window or locally, e.g., at an edge portion that is the weak portion of plasma uniformness or at the center of the edge.

Figure 9A:
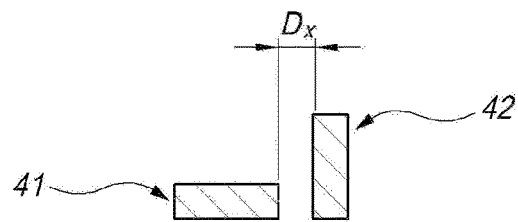
FIG. 9a to FIG. 9f are cross-sectional views showing modified examples of FIG. 8.
Figure 9B:
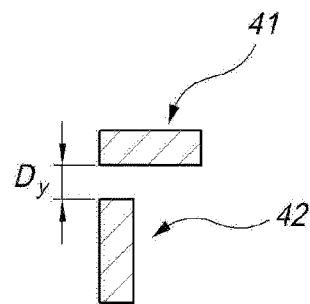
Figure 9C:
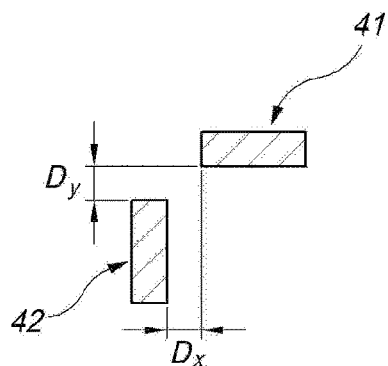

In addition, a pattern of the combination of the horizontal antenna portion 41 and the vertical antenna portion 42 may have various embodiments as shown in FIGS. 8 to 9c.

According to an embodiment, the horizontal antenna portion 41 and the vertical antenna portion 42 may be disposed at a distance Dx in the horizontal direction as shown in FIGS. 9a and 9c.

Here, regarding the relative height between the horizontal antenna portion 41 and the vertical antenna portion 42, the horizontal antenna portion 41 may be disposed near the center of the vertical antenna portion 42 as shown in FIG. 8, and the horizontal antenna portion 41 may be disposed around a center near the upper or lower end of the vertical antenna portion 42 as shown in FIGS. 9a and 9c.

Also, regarding a pattern of the combination of the horizontal antenna portion 41 and the vertical antenna portion 42 may be disposed at a distance Dx in the horizontal direction as shown in FIGS. 8, 9a and 9c.

According to another embodiment, one or more vertical antenna portions 42 may be installed at at least one of the upper and lower sides of the horizontal antenna portion 41 as shown in FIGS. 9b, and 9d to 9f.

According to another embodiment, the vertical antenna portions 42 may be installed at at least one of the upper and lower sides of the horizontal antenna portion 41 as shown in FIG. 9b.

Figure 9D:
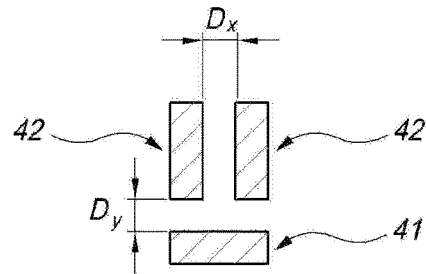

According to another embodiment, a pair of the vertical antenna portions 42 may be installed at the upper side of the horizontal antenna portion 41 as shown in FIG. 9d.

Figure 9E:
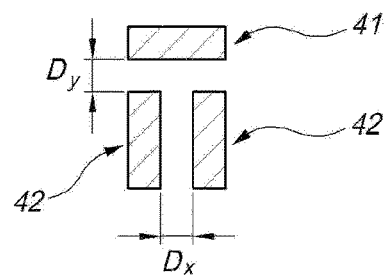

According to another embodiment, a pair of the vertical antenna portions 42 may be installed at the lower side of the horizontal antenna portion 41 as shown in FIG. 9e.

Figure 9F:
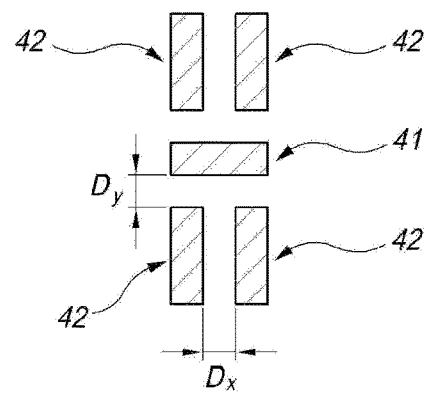

According to another embodiment, the vertical antenna portion 42 may be installed in pairs at the upper and lower sides of the horizontal antenna portion 41 as shown in FIG. 9f.

FIGS. 9d to 9f and embodiments thereof may also be performed as embodiments of the states vertically rotated from states in the drawings.

That is, the horizontal antenna portion 41 and the vertical antenna portion 42 may also be disposed in such a manner that the top surface of the dielectric window 100 is vertically disposed based on FIGS. 9d to 9f.

In other words, the horizontal antenna portion 41 and the vertical antenna portion 42 may be exchanged in FIGS. 9d to 9f.

Since induced electric field change and control at the lower part thereof are possible by various patterns as described above, it is possible to appropriately control formed plasma density.

The dielectric window 100 is a component that forms the upper window of the main container 10 and forms induced electric field below the dielectric window 100 by the RF power application of the RF antenna 40 that is installed over the dielectric window 100.

The dielectric window 100 may be installed in singularity or desirably, in plurality, and may be formed from ceramic such as $Al_2O_3$, quartz or the like.

According to an embodiment, the dielectric window 100 may have a plan view corresponding to a rectangle and be installed in plurality, the edges of a plurality of dielectric windows 100 may be supported by a dielectric supporting unit 400 so that the plurality of dielectric windows 100 may be arranged in a lattice pattern, and the dielectric windows may be installed over the main container 10.

The present invention is characterized in that a gas injecting structure is installed at at least a portion of the dielectric window 100 to be capable of performing the injecting control of processing gas on the substrate to be processed to be capable of performing uniform substrate processing.

That is, the structure of the ICP processing apparatus according to an embodiment of the present invention is characterized in that a diffusion plate 220 that diffuses processing gas into the main container 10 is provided with, and the diffusion plate 220 is formed at at least a portion of the bottom surface of the dielectric window 100.

The diffusion plate 220 is a component that diffuses the diffused processing gas into the main container 10.

According to an embodiment, the diffusion plate 220 may have the same material as the dielectric window 100, and may be formed integrally with the dielectric window 100 or as an independent member.

In addition, in the case where the diffusion plate 220 is formed separately from the dielectric window 100, there may be various coupling techniques, such as bolting, epoxy bonding, high-temperature epoxy bonding, ceramic bonding, or brazing (ceramic melting bonding), and for the uniformness of induced electric field formation, the epoxy bonding, the high-temperature epoxy bonding, the ceramic bonding, or the brazing (ceramic melting bonding), especially the ceramic bonding is desirable.

In addition, the diffusion plate 220 comprises a plurality of injection holes 221 so that processing gas may be diffused into the main container 10.

The diffusion plate 220 may have various embodiments according to an installation structure at the dielectric window 100.

The diffusion plate 220 may include a diffusion space that is connected to the branch pipe 310 of a processing gas supply pipe 300 to previously diffuse a processing gas.

For the formation of such a diffusion space, a separate additional diffusion plate may be additionally installed or as shown in FIGS. 1 and 4, a diffusing unit formed integrally with the dielectric window 100 may be formed.

The diffusing unit is a component that is formed separately form or integrally with the dielectric window 100 to diffuse the processing gas supplied through the branch pipe 310 to the diffusion space through a diffusion hole 110, and may have various configurations.

A diffusion member 320 that forms a processing gas diffusion space may be further installed between the branch pipe 310 and the diffusion plate 220.

The diffusion member 320 is a component that is coupled to the top surface of the dielectric window 100 to form the processing gas diffusion space, and may have various configurations.

The dielectric supporting unit 400 is a component that is coupled to the upper end of the main container 10 and supports the plurality of dielectric windows 100 to seal the inside of the main container 10.

According to an embodiment, the dielectric supporting unit 400 may include an outer frame 410 that is supported at the upper end of the main container 10, and a central frame 420 that is coupled to the outer frame 410, includes an opening 401 corresponding to the plan view of each dielectric window 100, includes a supporting portion 402 supporting the bottom edge of the dielectric window 100, and has ceramic material at least partly.

The outer frame 410 is a component that is supported at the upper end of the main container 10, and may have various configurations.

The outer frame 410 may have the L-shaped structure in cross section in order to support the dielectric window 100 directly or indirectly.

In addition, the outer frame 410 may have ceramic material, or metallic material such as aluminum or an alloy thereof, and it is desirable to have the metallic material in order to reinforce strength.

The central frame 420 is a component that is coupled to the outer frame 410 and forms the opening 401 corresponding to the plan view of each dielectric window 100, and may have various configurations.

According to an embodiment, the central frame 420 has an end coupled to the outer frame 410, may have a plan view corresponding to a lattice structure, such as a "+" shape, to form the opening 401 corresponding to the plan view of each dielectric window 100.

According to another embodiment, the central frame 420 may be coupled to the outer frame 410, include the opening 401 corresponding to the plan view of each dielectric window 100, and the supporting portion 402 supporting the bottom edge of the dielectric window 100.

The opening 401 is an opening that the dielectric window 100 covers, and may have various configurations according to the structure of the dielectric window 100.

Here, the dielectric window 100 may have a stepped edge to be capable of being supported by the supporting portion 402 of the central frame 420.

The central frame 320 may desirably have ceramic material such as $Al_2O_3$ at least partly rather than metallic material for the efficiency of induced electric field formed by the RF antenna 40 and more desirably, it may wholly have the ceramic material such as $Al_2O_3$.

Also, the plan views of the dielectric supporting unit 400 and the dielectric window 100 may be rectangles, in which case the central frame 420 may be divided into a plurality of sections in the direction of at least one of both sides of the rectangle around the openings 401.

When the central frame 420 is divided into a plurality of sections in the direction of at least one of both sides of the rectangle around the openings 401 as described above, it is possible to efficiently configure the upper window for the processing of a large substrate S to be processed.

According to a more particular embodiment, the central frame 420 divided into the plurality of sections as shown in FIGS. 3a and 3b may have a protrusion 434 and a recess 422 at a surface being in contact with an adjacent central frame 420 to partly overlap when viewed in the vertical direction.

In addition, the central frame 420 divided into the plurality of sections may be desirably bonded by epoxy bonding, high-temperature epoxy bonding, ceramic bonding, or brazing (ceramic melting bonding), and more desirably coupled by, especially, the ceramic bonding.

Here, when considering that there may be damage by plasma permeation into the gap between adjacent central frames 420, a shield member (not shown) formed from ceramic material may be installed at the bottom surface thereof.

The technology to form a single member from the divided ceramic material in a plurality of sections by the epoxy bonding, the high-temperature epoxy bonding, the ceramic bonding, or the brazing (ceramic melting bonding) as described above may be applied to all structures for the formation of a large member by the coupling of ceramic members in addition to the formation of the dielectric supporting unit 400 for the supporting of the dielectric window 100.

According to an embodiment, the technology to form a single member from the divided ceramic material in a plurality of sections by the epoxy bonding, the high-temperature epoxy bonding, the ceramic bonding, or the brazing (ceramic melting bonding) as described above may be applied to various members, such as a dielectric window formed from ceramic material such as $Al_2O_3$, a portion of an electrostatic chuck, or a shield member.

For the sealing of the inside of the main container 10, O-rings 51 to 53 may be desirably installed on a surface at which the outer frame 410, the central frame 420, and the dielectric window 100 are in contact with one another.

What is claimed is:

1. A dielectric window supporting structure of inductively coupled plasma (ICP) processing apparatus that comprises
    a main container that houses a substrate to be processed to perform plasma processing,
    a substrate mounting unit on which the substrate to be processed is mounted in the main container,
    an exhaust system that discharges gas from inside of the main container,
    a plurality of dielectric windows that form an upper window of the main container,
    a dielectric supporting unit that is coupled to an upper end of the main container and supports the dielectric window to seal the inside of the main container, and
    one or more RF antennas which are installed to correspond to the plurality of the dielectric windows outside the main container and to which RF power is supplied to form an induced electric field in the main container,
    wherein the dielectric supporting unit includes:
    a central frame that includes an opening corresponding to a plan view of each dielectric window, the central frame including a supporting portion which supports a bottom edge of the dielectric window fitted in the opening, the central frame having a ceramic material in order to minimize power loss when the induced electric field by the RF antennas is formed; and
    an outer frame that has a metallic material, the outer frame being coupled to the central frame in a perimeter of the central frame to support the central frame, the outer frame being supported by the upper end of the main container.

2. The dielectric window supporting structure of inductively coupled plasma (ICP) processing apparatus of claim 1, wherein plan views of the dielectric supporting unit and the dielectric window are rectangles.

3. The dielectric window supporting structure of inductively coupled plasma (ICP) processing apparatus of claim 2, wherein the central frame is divided into a plurality of sections in the direction of at least one of both sides of the rectangle around the openings.

4. The dielectric window supporting structure of inductively coupled plasma (ICP) processing apparatus of claim 3, wherein the central frame divided into the plurality of sections has a protrusion and a recess at a surface being in contact with an adjacent central frame to partly overlap when viewed in the vertical direction.

5. The dielectric window supporting structure of inductively coupled plasma (ICP) processing apparatus of claim 3, wherein the central frame divided into the plurality of sections is coupled by ceramic bonding.

6. The dielectric window supporting structure of inductively coupled plasma (ICP) processing apparatus of claim 1, wherein the outer frame is interposed between the central frame and the main container, such that the outer frame has a first surface in contact with the central frame and a second surface in contact with the upper end of the main container.

\* \* \* \* \*